US007477015B2

(12) United States Patent
Nakamura

(10) Patent No.: US 7,477,015 B2
(45) Date of Patent: *Jan. 13, 2009

(54) SEALING GLASS SUBSTRATE FOR ORGANIC EL MATERIAL AND METHOD OF MANUFACTURING ORGANIC EL DISPLAY

(75) Inventor: Hideyo Nakamura, Nagano (JP)

(73) Assignee: Fuji Electric Holdings Co., Ltd., Kawasaki (JP)

( * ) Notice: Subject to any disclaimer, the term of this patent is extended or adjusted under 35 U.S.C. 154(b) by 279 days.

This patent is subject to a terminal disclaimer.

(21) Appl. No.: 11/258,369

(22) Filed: Oct. 26, 2005

(65) Prior Publication Data

US 2006/0091799 A1    May 4, 2006

(30) Foreign Application Priority Data

Oct. 28, 2004    (JP)    ............................. 2004-314558

(51) Int. Cl.
*H01J 1/62* (2006.01)
*H01J 63/04* (2006.01)

(52) U.S. Cl. ....................... 313/512; 313/504; 313/317; 313/318.08; 313/498; 445/24; 445/25

(58) Field of Classification Search ......... 313/498–512; 445/25
See application file for complete search history.

(56) References Cited

U.S. PATENT DOCUMENTS

| 7,112,115 | B1 * | 9/2006 | Yamazaki et al. | ............. 445/25 |
| 2002/0155320 | A1 * | 10/2002 | Park et al. | .................... 428/690 |
| 2003/0218422 | A1 * | 11/2003 | Park et al. | .................... 313/512 |
| 2004/0046494 | A1 * | 3/2004 | Lai | ............................ 313/504 |

FOREIGN PATENT DOCUMENTS

| JP | 2000-100562 | 4/2000 |
| JP | 2001-189191 | 7/2001 |

* cited by examiner

*Primary Examiner*—Nimeshkumar D Patel
*Assistant Examiner*—Thomas A Hollweg
(74) *Attorney, Agent, or Firm*—Rabin & Berdo, PC

(57) ABSTRACT

A sealing glass substrate that allows control of adhesion width and ready cutting of the glass substrate without extending the cutting position in a process of manufacturing organic EL displays by sealing and cutting an organic EL substrate containing one or more organic EL (electroluminescent) display parts. The sealing glass substrate seals an organic EL substrate that includes one or more organic EL laminates. The sealing glass substrate is formed of a glass plate and includes one or more recesses each opposing one of the organic EL laminates. An adhesion region surrounds each recess, and an adhesion escape groove surrounds each adhesion region. The recesses and adhesion escape grooves are of substantially equal depth.

27 Claims, 9 Drawing Sheets

Fig. 8A1
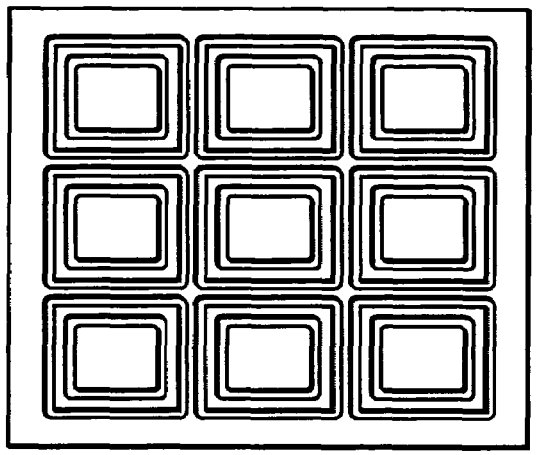
Fig. 8B1
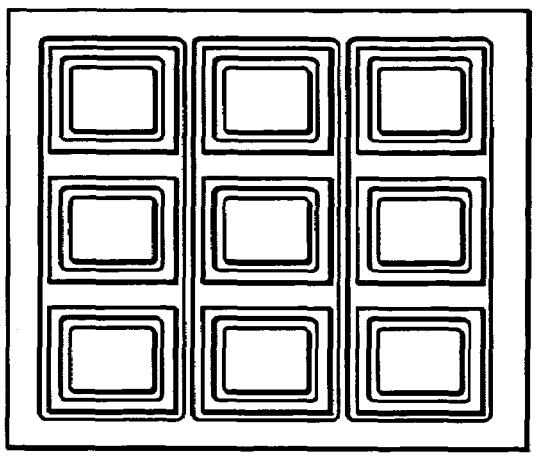
Fig. 8A2
Fig. 8B2
Fig. 8C1
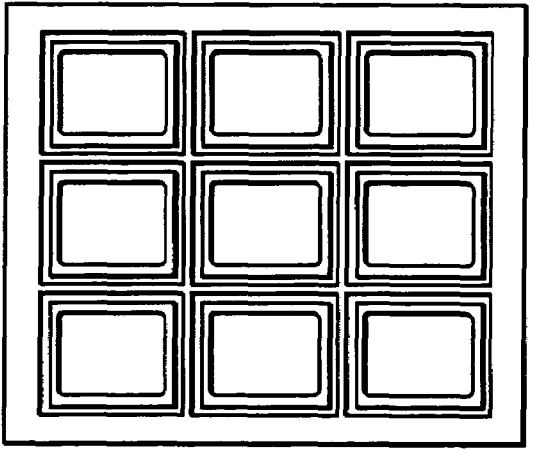
Fig. 8D1
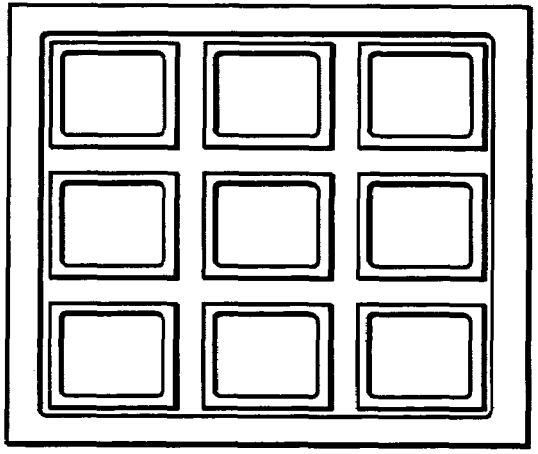
Fig. 8C2
Fig. 8D2

SEALING GLASS SUBSTRATE FOR ORGANIC EL MATERIAL AND METHOD OF MANUFACTURING ORGANIC EL DISPLAY

CROSS-REFERENCE TO RELATED APPLICATION

This application is based on, and claims priority to, Japanese Application No. 2004-314558, filed on Oct. 28, 2004, the contents of which are incorporated herein by reference.

BACKGROUND OF THE INVENTION

1. Field of the Invention

The invention relates to a sealing glass substrate for organic EL (electroluminescent) material and a method of manufacturing an organic EL display using the sealing glass substrate. More specifically, the invention relates to a sealing glass substrate for organic EL material, provided with an escape groove for adhesive in an outer periphery of an adhesion member.

2. Description of the Related Art

A conventional sealed organic EL display, a bottom emission type sealed organic EL display in particular, has a structure shown in FIGS. 1A, 1B and 1C. The organic EL display in the sectional view of FIG. 1A includes a laminate 12 having a transparent electrode, an organic EL layer, a reflection electrode formed on a glass substrate 11, and a lead out terminal 17a electrically connected to the reflection electrode of the laminate 12. An adhesive 13 is applied around the laminate 12 and adheres the laminate to a sealing glass substrate 14.

The organic EL layer, being very vulnerable to oxygen and moisture, easily loses its ability to emit light upon exposure to the atmosphere. Accordingly, an organic EL layer is usually sealed by a sealing glass substrate 14 having a moisture absorber 15 disposed opposing the laminate 12 in a chamber with extremely reduced oxygen and moisture. To prevent the organic EL layer and other laminated films from being touched, and to ensure that a space is provided for accommodating the moisture absorber, a recess may be created in the sealing substrate in the portion opposing the laminate of the organic EL layer and other films. The adhesive 13 can be of the type that hardens in response to application of ultraviolet light, for example. FIG. 1B is a plan view of this structure taken from the side of the glass substrate 11. An organic EL display area for light emission from the organic EL layer is formed in the location corresponding to the laminate 12. A sealing region is formed in the area corresponding to the adhesive 13. FIG. 1C is a plan view of this structure taken from the side of the sealing glass substrate 14 in which lead out terminals 17a and 17b are exposed. The lead out terminal 17a is electrically connected to the reflection electrode and the lead out terminal 17b is electrically connected to the transparent electrode.

Mass production of organic EL displays is generally carried out by forming multiple organic EL display areas on a glass substrate, sealing with a sealing glass substrate, and then cutting those substrates to form multiple organic EL displays. FIG. 2 shows a sealing substrate 21 and a substrate 25 for multiple organic EL displays. The substrate 25 includes multiple combinations of a laminate 26 containing a transparent electrode, an organic EL layer, and other layers (which forms an organic EL display area together with a reflection electrode) and a lead out terminal 27 electrically connected to the reflection electrode adjacent to the laminate 26. The sealing substrate 21 has recesses 22 at positions opposing the respective laminates 26. Adhesive is applied around each recess 22 by means of a dispenser or by screen printing, and the two substrates are laminated as shown in FIGS. 3A, 3B and 3C. FIG. 3A is a sectional view, FIG. 3B is a plan view taken from the side of the substrate 25, and FIG. 3C is a plan view taken from the side of the sealing substrate 21. In the laminating process, the adhesive (ultraviolet light-hardening resin) is pressed by exerting external pressure after the elements are combined, or the elements are combined under a reduced pressure and then atmospheric pressure is restored. After curing the adhesive by irradiating it with ultraviolet light, the sealing substrate 21 is cut along the line 32, and the substrate 25 is cut along the line 31, to obtain the shape shown in FIG. 1A. The cutting is carried out primarily by a scribe method in which small nicks are formed on the glass surface using a diamond cutter or the like, and then cracks are developed by striking from the back side or exerting stress to cleave the glass.

The use of a material other than glass for the sealing substrate has been proposed. (See Japanese Unexamined Patent Application Publication No. 2001-189191 and Japanese Unexamined Patent Application Publication No. 2000-100562). In the structure shown in Japanese Unexamined Patent Application Publication No. 2001-189191, two grooves are formed at both sides of an adhesion application region of a sealing plate of stainless steel manufactured by drawing control, and expansion of the adhesive is restrained. The sealing plate in Japanese Unexamined Patent Application Publication No. 2001-189191 is, however, not planar and has a shape difficult to fabricate of glass. In addition, the adhesive is permitted to expand laterally beyond the grooves and the structure does not take into account the cutting after sealing.

Japanese Unexamined Patent Application Publication No. 2000-100562 discloses a structure that restrains invasion of adhesive into a space for accommodating a light emitting part, by disposing a groove on an adhesive application region in a sealing body of metal or the like. The sealing board disclosed in Japanese Unexamined Patent Application Publication No. 2000-100562 is, again, not planar, and difficult to fabricate with glass. The structure restrains invasion of adhesive into a space for accommodating a light emitting part by permitting outward expansion of the adhesive, and therefore does not consider cutting work after the sealing.

In the method of manufacturing the organic EL display of FIGS. 1A, 1B and 1C, from the combination of FIGS. 3A, 3B and 3C, the adhesive may run off from the predetermined location and extend laterally in the process of laminating the two substrates 21 and 25. If the runoff adhesive expands to the cutting position, the produced nick fails to cut the glass at the desired position (see FIG. 6A). Even if a nick is produced in an area the adhesive exists, the crack does not extend, or extends to a direction where the adhesive is absent, generating defects such as flaking, burrs, and cracking, as illustrated in FIGS. 9A, 9B and 9C, respectively.

Accordingly, the cutting position must be determined in the outside region from the extended adhesive with enough clearance. Or if some restriction is imposed on the cutting position, the adhesion width is narrowed or the adhesive is not pressed strongly, preventing the adhesive from expanding uncontrollably from the position at which it is applied.

Control of the degree of expansion of the width of the adhesive becomes difficult as the degree to which the substrates are of squeezed together increases and requires excessive space. As a result, a peripheral region of an EL display area called "a picture frame" expands, and the external dimension of the display enlarges, thus decreasing the number of displays that can be produced from one substrate and causing an increase of the cost. The narrowing of the width of adhesion and the decrease in the amount of squeeze, on the other hand, cause a decrease in sealing performance and leads to a corresponding degradation of the organic EL layer from oxygen or moisture.

Penetrating the glass substrate to form a recess generates distortion of several tens of microns in the height around the recess, making it is difficult to apply adhesive uniformly around it. If the application is nonuniform, then uniform pressing causes different degrees of expansion of the adhesive (adhesion width) from place to place. If a precise application of adhesive is desired on a distorted surface, a costly system, which measures the height of the surface to which the adhesive is to be applied and applies the adhesive strictly following the height, would be needed.

SUMMARY OF THE INVENTION

Therefore, an object of the invention is, in a process of manufacturing organic EL displays by sealing with a glass substrate and cutting an organic EL substrate having a plurality of organic EL display parts, to achieve a structure that can control the width of the area adhesion, and facilitate the cutting without extending a cutting position of the glass, even when, in the process of laminating the sealing glass substrate over the organic EL substrate the area of adhesion between the substrates is sufficiently wide and the substrates are pressed together to such an extent that a thickness of the adhesive between substrates is only several microns. Such a structure provides long-life organic EL displays at low cost.

To meet this objective, the invention provides a sealing glass substrate having an adhesive escape groove surrounding each recess opposing an organic EL display part. The amount of adhesive applied is a little more than the amount needed to form a desired width and thickness, and less than the amount needed to completely fill the escape groove. The sealing glass substrate is cut by forming a nick at a position at the inner periphery of the adhesive escape groove, and the organic EL substrate is cut at a position outward of the inner periphery of the adhesive escape groove.

When an organic EL substrate and a sealing glass substrate according to the structure and the method of the invention are combined using an adhesive, even if the amount of adhesive and the pressure applied are not uniform, the excess adhesive extends vertically in the adhesive escape groove and does not extend laterally beyond the adhesive escape groove. As a result, the sealing region formed after the adhesive is cured has a nearly uniform width throughout the sealing region. After the curing, since the glass of the sealing substrate is cut along the inner periphery of the escape groove, a clean cut surface free of burrs is obtained. Also, since the adhesive stops clear of the vicinity of the inner periphery of the escape groove, the organic EL substrate can be cut clearly at a position free of the adhesive (at an unadhered position) by providing a nick at a location just beyond the extent of the adhesive.

According to the sealing structure and the sealing method of the invention, the width of a sealing region can be controlled readily even when the area of adhesion is wide and the cured adhesive layer is thin. Therefore, the seal is improved without enlarging the peripheral area of a display. Or, with a conventional sealing width, the outline dimension of the display can be reduced, thereby increasing the number of organic EL displays that can be produced from a single sheet of substrate material. Moreover, the process can be carried out using inexpensive application and lamination devices. Since the sealing also is performed efficiently, inexpensive, long-life organic EL displays can be obtained.

BRIEF DESCRIPTION OF THE DRAWINGS

FIGS. 8A1-8D2 show variations of the sealing glass substrate according to the invention, wherein FIGS. 8A1 and 8A2 illustrate a structure in which adhesive escape grooves are provided at both sides of an adhesion region, FIGS. 8B1 and 8B2 illustrate a structure in which the adhesive escape groove is partly joined to the adjacent adhesive escape groove, FIGS. 8C1 and 8C2 illustrate a structure in which the outer circumferential sidewalls of the adhesive escape grooves have right-angle vertexes, and FIGS. 8D1 and 8D2 illustrate show a structure in which all the adhesive escape grooves are connected.

DETAILED DESCRIPTION OF THE INVENTION

Figure 4B:
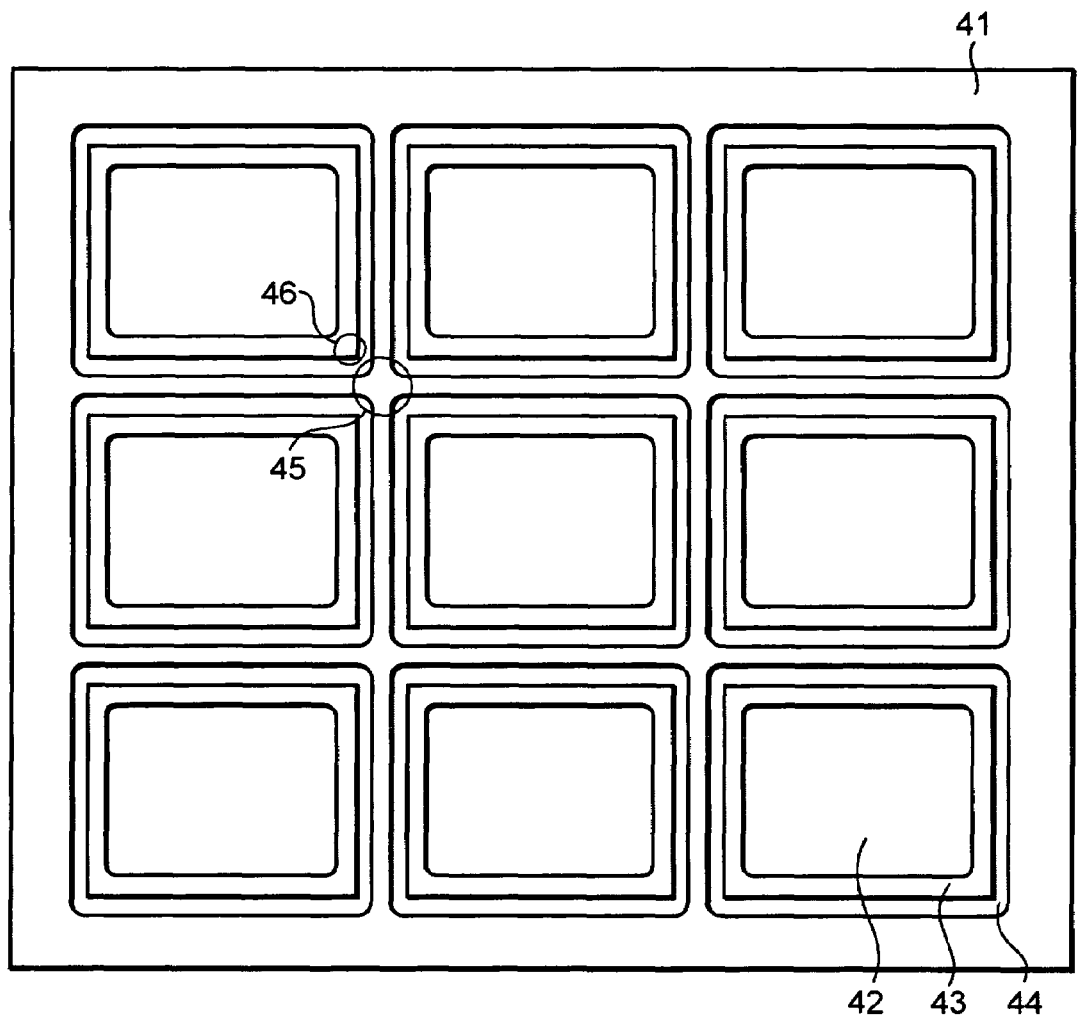
FIGS. 4A and 4B are respectively a sectional view and a plan view of a sealing glass substrate according to the invention.
Figure 4A:
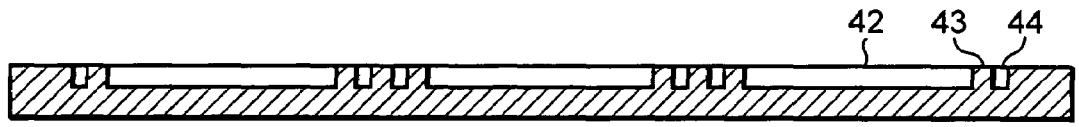

FIG. 4A is a sectional view showing a sealing glass substrate 41 according to the invention, and FIG. 4B is a plan view of the sealing glass substrate 41 taken from the side of the adhesive escape grooves. The sealing glass substrate 41 has a structure useful for manufacturing several organic EL (electroluminescent) displays at one time by combining the sealing glass substrate with an organic EL substrate 53 having a number of organic EL laminates, and by cutting the combination into separate organic EL displays. The sealing glass substrate 41 is generally formed of a glass plate and includes recesses 42 each opposing an organic EL laminate, adhesion regions 43 each surrounding a respective recess 42, and adhesive escape grooves 44 each surrounding a respective adhesive region 43. The adhesive escape grooves 44 each correspond to an organic EL laminate in a one-to-one corresponding manner and do not connect to any adhesive escape groove that corresponds to another organic EL laminate, (that is, each groove 44 is separately arranged).

Each recess 42 is generally rectangular so as to correspond to the shape of an organic EL laminate. The length and breadth of the recess 42 are preferably about 500 μm larger on a side than that of the organic EL laminate. The depth of the recess must be larger than the sum of the thickness of a moisture absorber and the thickness of the organic EL laminate, less the thickness of the adhesion. An additional allowance is desirable in consideration of distortion in the sealing glass substrate and the tolerance of working accuracy. The depth of the recess is generally in the range of 200 to 500 μm. The adhesion region 43 preferably has a width in the range of 1 to 5 mm depending on the size of the organic EL laminate.

Each adhesive escape groove 44 must have a width and depth sufficient to prevent extension of the adhesive beyond the groove during the lamination process. The width of the adhesive escape groove is generally in the range of 0.5 to 2 mm, preferably in the range of 0.75 to 1.5 mm. The depth of the adhesive escape groove 44 is generally in the range of 200 to 500 μm. It is desirable that the adhesive escape groove 44 and the recess 42 have a common depth. It is preferable that the four vertexes 45 of the outer periphery of the adhesive escape groove 44 be rounded. Rounded vertexes 45 ensure maintenance of the strength of the sealing glass substrate 41 during the processes of fabricating the recesses 42 and the adhesive escape grooves 44. On the other hand, it is preferable that the four vertexes 46 of the inner periphery of each adhesive escape groove 44 not be rounded, but rather are right angle vertexes. The inner periphery of the adhesive escape groove 44 is the position of orthogonal cutting lines in the process of cutting the sealing glass substrate by a scribe method. If the vertexes are rounded, burrs with a hood-shape are generated in the cutting process.

The sealing glass substrate 41 of the invention can be obtained by etching or sandblasting the glass substrate to form the recesses 42 and the adhesive escape grooves 44. By employing those, methods simultaneously to obtain a common depth in both of the recesses 42 and the adhesive escape grooves 44, the production costs do not increase as compared with those to produce a conventional sealing glass substrate having only recesses (shown in FIG. 2).

Figure 5B:
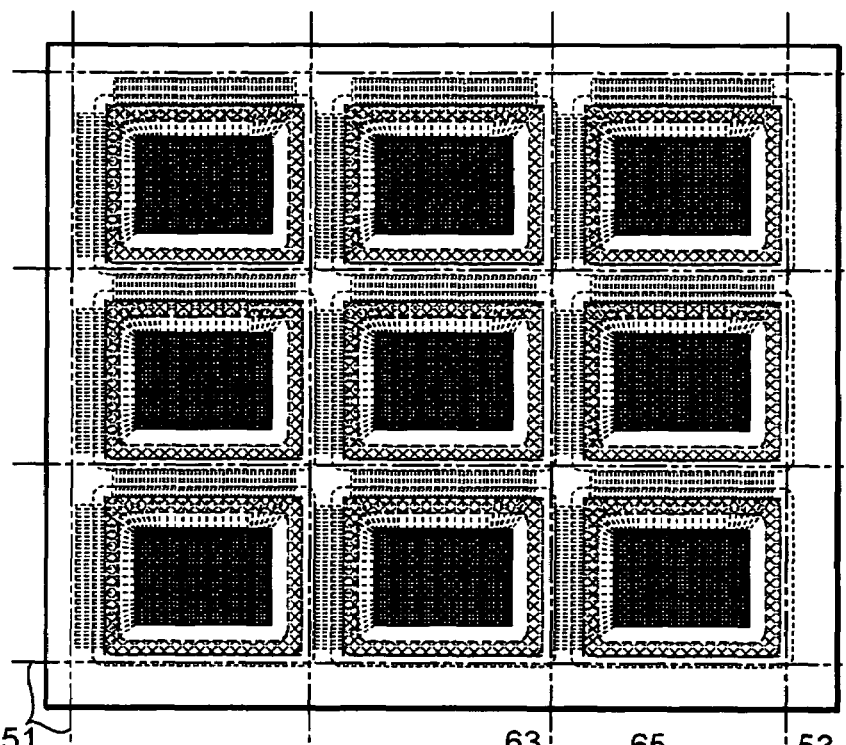
FIGS. 5A, 5B and 5C are respectively a sectional view, a plan view from an organic EL substrate side and a plan view from a sealing substrate side that illustrate sealing and cutting according to the invention.
Figure 5A:
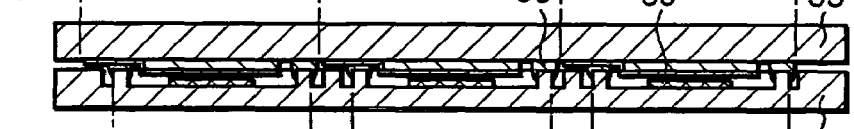
Figure 5C:
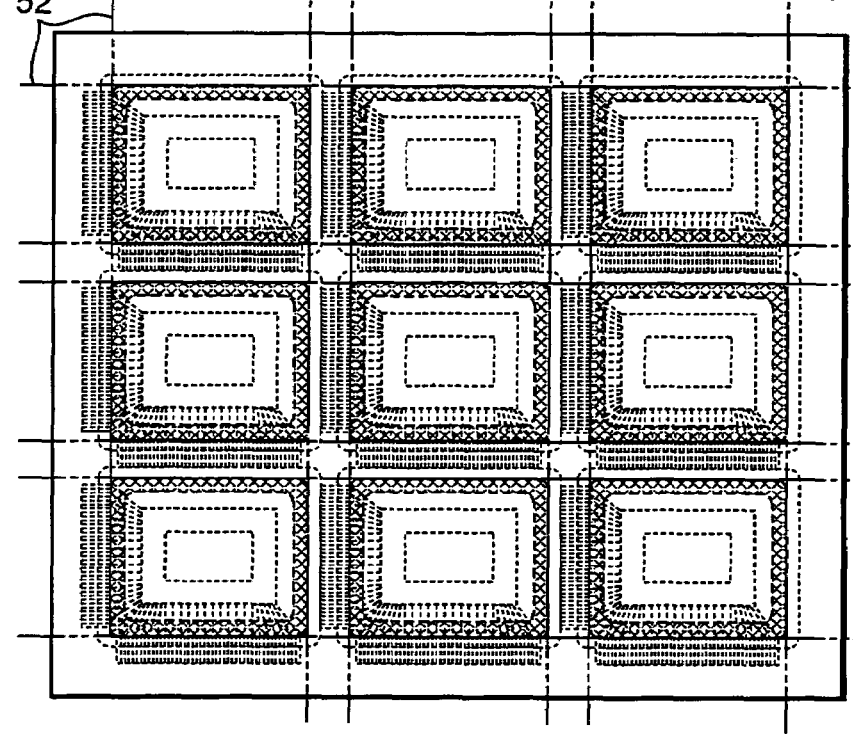

Referring now to FIGS. 5A, 5B and 5C illustrating lamination of the sealing glass substrate 41 and the organic EL substrate 53, and the cutting process of the two substrates, a moisture absorber 65 can be disposed in each recess 42 of the sealing glass substrate 41. The moisture absorber 65 can be formed of a material known in the art, for example, a package containing calcium oxide with a sealing member. An adhesive 63 is applied on an adhesion region 43 using screen-printing or a general-purpose dispenser. The adhesive 63 can be an ultraviolet light-curing type adhesive known in the art. Adhesive containing spacers, for example glass beads with uniform grain size, can be used as necessary. The spacer-containing adhesive is effective to ensure minimum adhesion thickness and to avoid excessive squeezing of the adhesive.

Figure 6A:
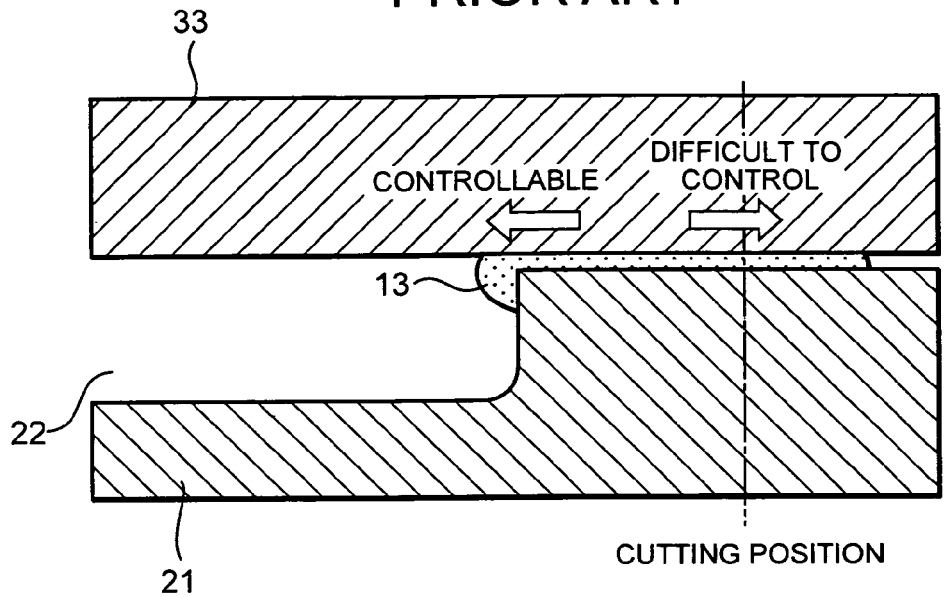
FIGS. 6A and 6B are sectional views illustrating extension of the adhesives according to the method of conventional technology and according to the method of the invention, respectively.
Figure 6B:
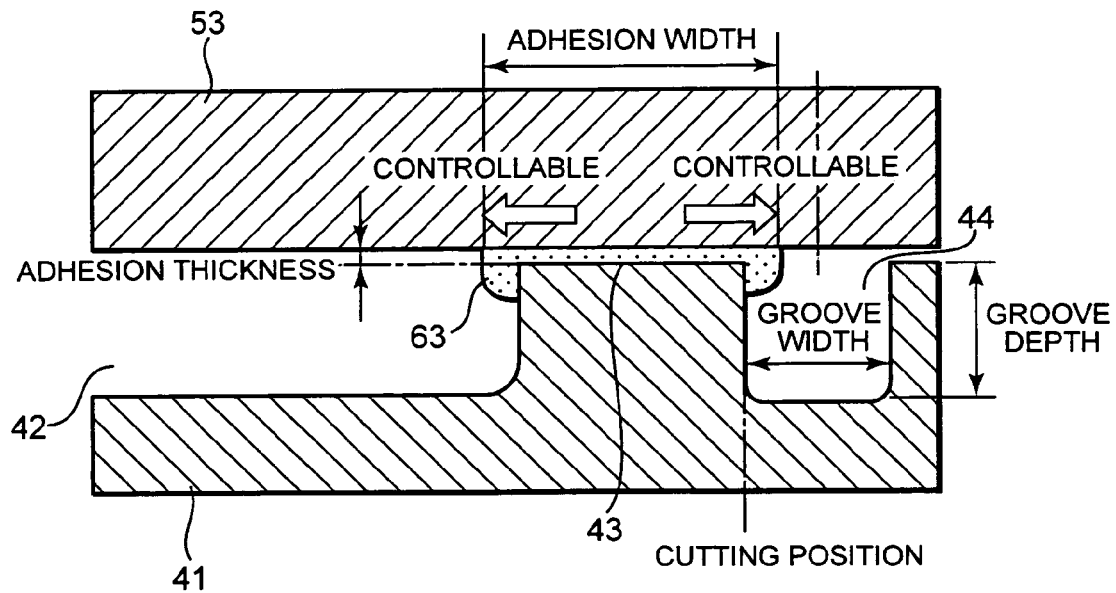

Lamination of the organic EL substrate 53 and the sealing glass substrate 41 can be performed, for example, in any of the following ways: (a) combining and pressing the two substrates, (b) combining the two substrates in an environment below atmospheric pressure followed by restoring atmospheric pressure, or (c) performing the processes (a) and (b) together. By combining the substrates and squeezing the adhesive, the adhesive 63 extends laterally as shown in FIG. 6B. Then, the excessive adhesive 63 runs off the adhesion region 43 and begins to flow into the adhesive escape groove 44 extending vertically, and is prevented from expanding laterally beyond the adhesive escape groove 44. The adhesive 63 extends laterally inward as well. Here, the adhesive is also prevented from expanding laterally owing to the vertical extension in the recess 42. To prevent the adhesive 63 from extending laterally, the volume of adhesive application per unit length is controlled to be larger than the width of the adhesion region times the adhesion thickness, and sufficiently smaller than the sum of the width of the adhesion region times the adhesion thickness and the width of the adhesive escape groove times the depth of the adhesive escape groove. Then the width of the adhesion region is approximately equal to the adhesion width. Here, "adhesion thickness" means the final thickness of the adhesive in the adhesion region 43. With the amount of adhesive applied as described above and considering the extension of the adhesive toward both the adhesive escape groove 44 and the recess 42, the amount of adhesive that runs off into each adhesive escape groove 44 and recess 42 is less than half the volume of the adhesive escape groove per unit length (width times depth). Consequently, runoff of adhesive to the bottom surface of the adhesive escape groove 44 can be almost avoided. Here, it is desired that the adhesive does not reach the bottom of the inner periphery of the adhesive escape groove 44 and the outer peripheral sidewall of the adhesive escape groove 44. To meet this requirement, it is desirable that the width of the adhesive escape groove 44 be larger than half the width of the adhesion region 43 plus tolerance, and that the volume of the adhesive application per unit length be more than the width of the adhesion region times the adhesion thickness, and less than 0.5 ×[(the width of the adhesion region×the adhesion thickness)+(half the width of the adhesion region 43 plus tolerance)×(twice the depth of the adhesive escape groove)]. The extension of adhesive can be controlled according to the invention even with a final thickness of the adhesive 63 below 10 μm. The extension of adhesive can of course be controlled more readily with a conventional adhesion thickness of in the range of 10 to 50 μm.

After the combining process is performed as described above, the adhesive 63 is cured by irradiating it with ultraviolet light. The wavelength, intensity, and time of irradiation of the applied ultraviolet light is appropriately determined depending on the type and thickness of the employed adhesive 63. In general, satisfactory curing can be performed using an ultraviolet light lamp having a peak wavelength at 365 nm and an illumination intensity of 100 mW/cm$^2$, and applying the light for 60 seconds.

Finally, the sealing glass substrate 41 and the organic EL substrate 53 are cut by a scribe method to form multiple organic EL displays. The position of a cutting line 52 of the sealing glass substrate 41 preferably is the position of the inner peripheral sidewall of the adhesive escape groove 44. Cutting at this position avoids generation of hood-shaped protrusions (burrs) in the periphery of the sealing glass substrate 41. If deviation of lamination position or cutting position is of concern, a nick can be provided just inside the inner peripheral sidewall of the adhesive escape groove 44 before the scribe method is applied. Since the region inward of the adhesive escape groove 44 (that is, the adhesion region 43) is strengthened with the adhesive 63, the fracture of the sealing glass substrate 41 progresses from the nick toward the inner peripheral sidewall of the adhesive escape groove 44. Concerning the cutting of the organic EL substrate 53, while the width of the adhesive 63 (that is, the adhesion width) is controlled to be approximately the same as the width of the adhesion region 43, small protrusions are formed that must be avoided by the cutting line. Accordingly, the cutting line 51 of the organic EL substrate 53 can be located outside the inner peripheral sidewall of the adhesive escape groove 44 (or outside the lead out terminal region of the organic EL display at an edge adjacent to the terminal region) and at a position not overlapping the adjacent lead out terminal region of the organic EL display. The cutting line preferably is positioned outside the inner peripheral sidewall of the adhesive escape groove 44 (or outside the lead out terminal region of the organic EL display at an edge adjacent to that terminal region) distant from the sidewall (or the terminal region) by at least 0.3 mm, preferably at least 0.5 mm, and positioned inside the outer peripheral sidewall of the adhesive escape groove. Since the adhesive is absent in this area owing to the effect of the adhesive escape groove 44, the cutting can be performed satisfactory.

In actual practice, employing the above-described structure and method, an ideal sealing structure has been readily achieved with an adhesion width (width of the adhesion region) of at least 2 mm and a thickness of the adhesive of about 6 μm, using a general-purpose dispenser and a simple laminating device. If a conventional sealing substrate 21 (without an adhesive escape groove 44) is used, the lateral extension of adhesive is difficult to control. If an effort is made to obtain an adhesion width of 2 mm and a thickness of adhesive of several μm, the lateral extent of the adhesive is so great that the peripheral region of the adhesive becomes wavy. To suppress such an occurrence would require an apparatus to apply the adhesive with very high precision that strictly follows the shape of the surface to which it is to be applied, and would further require a large scale lamination system that controls the compression force with extreme accuracy. Such an apparatus and system would be very costly.

Figure 1B:
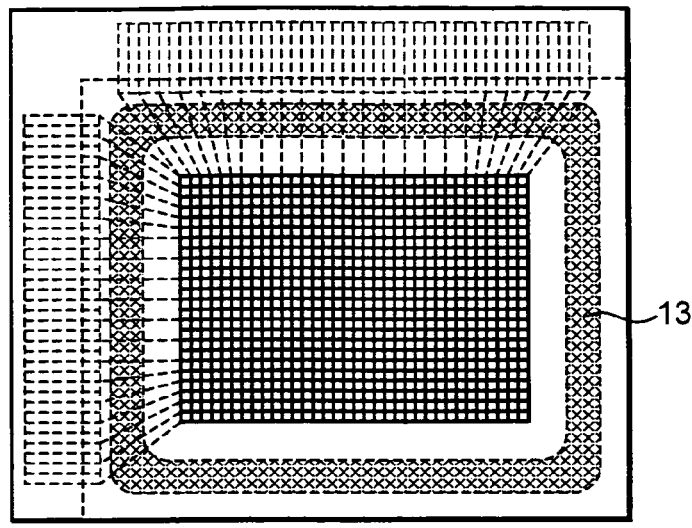
FIGS. 1A, 1B and 1C are respectively a sectional view, a plan view from an organic EL substrate side and a plan view from a sealing substrate side of an organic EL display manufactured by conventional technology.
Figure 1A:
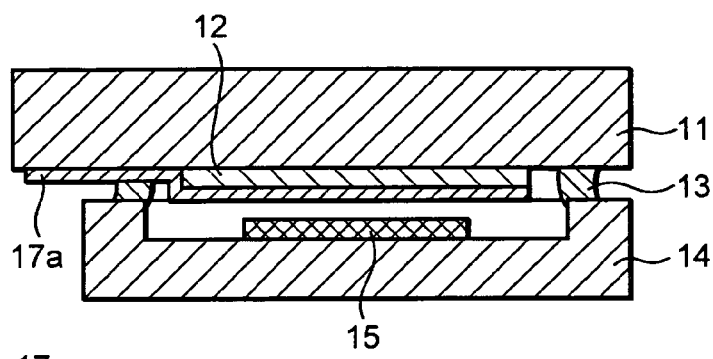
Figure 1C:
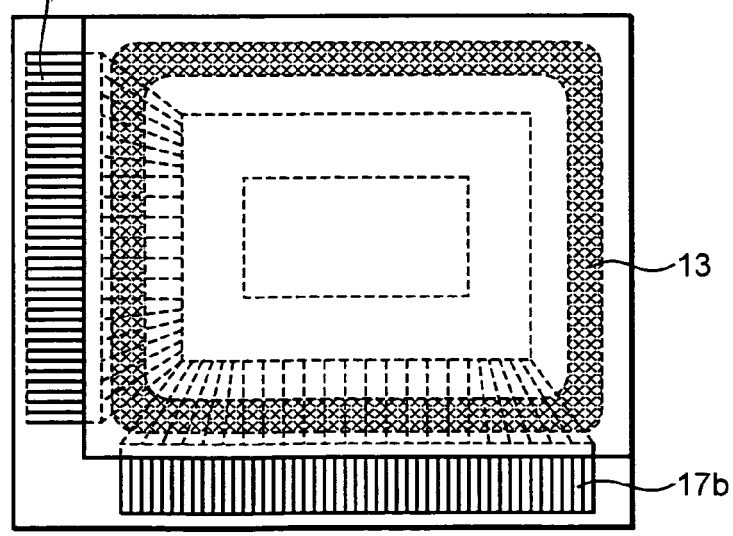
Figure 2:
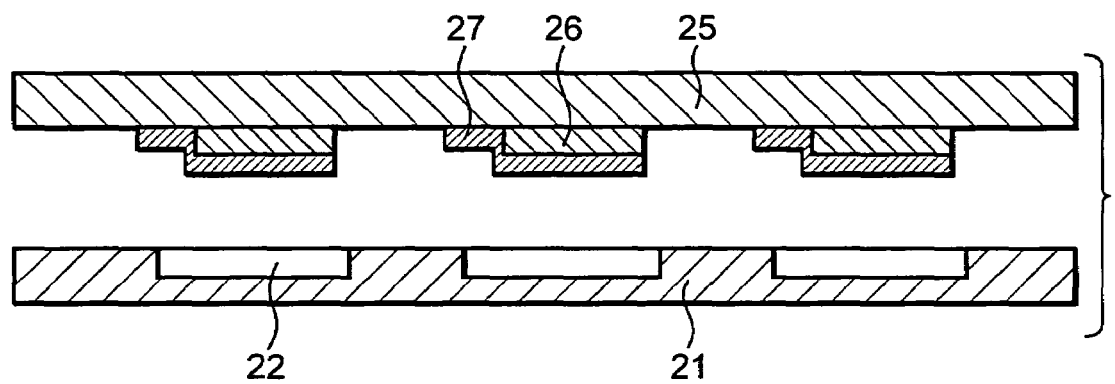
FIG. 2 is a sectional view of an organic EL substrate for multiple organic EL displays and a sealing glass substrate according to conventional technology.
Figure 3B:
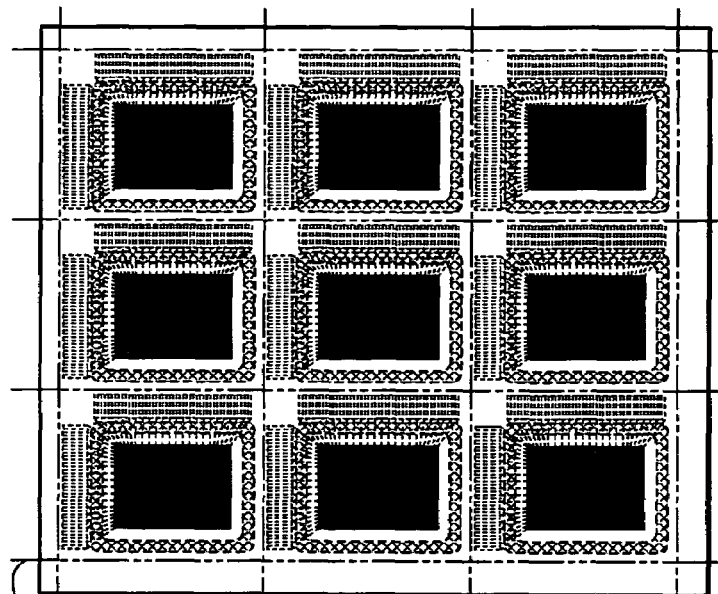
FIGS. 3A, 3B and 3C are respectively a sectional view, a plan view from an organic EL substrate side and a plan view from a sealing substrate side that illustrate sealing and cutting according to the conventional technology.
Figure 3A:
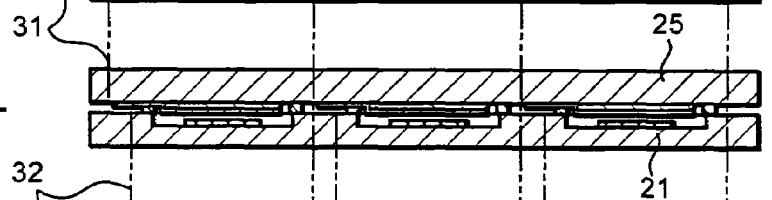
Figure 3C:
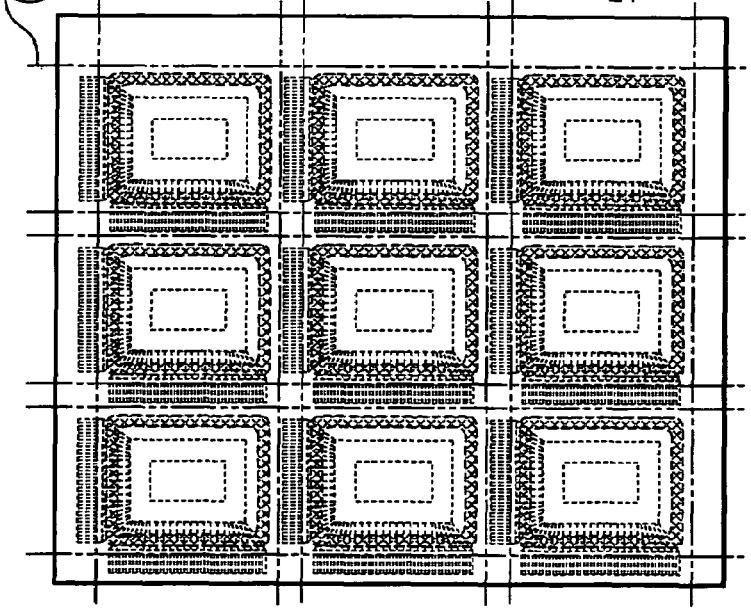

The sealing glass substrate 41 of the invention may have a structure provided with adhesive escape grooves in both sides of the adhesion region and a recess opposing the organic EL laminate distinct from the adhesive escape groove. The second adhesive escape groove disposed outside the adhesion region is equivalent to the adhesive escape groove 44 in FIGS. 4A and 4B and preferably has a similar width and depth. The first adhesive escape groove disposed inside the adhesion region prevents the adhesive from extending towards the organic EL laminate and preferably has a width and depth similar to that of the adhesive escape groove 44 of FIGS. 4A and 4B. In this type of embodiment, a variation is possible as shown in FIGS. 8A1 and 8A2, in which no recess is provided at the position opposing the organic EL laminate but grooves are provided at both sides of the adhesion region. That is, as shown in FIGS. 8A1 and 8A2, a first adhesive escape groove is disposed inside the adhesion region to prevent the adhesive from extending to the area opposing the organic EL laminate, and a second adhesive escape groove is disposed to prevent the adhesive from extending toward the organic EL laminate.

To prevent the adhesive 63 from extending laterally in the structure having a first adhesive escape groove and a second adhesive escape groove as described above, the volume of adhesive applied per unit length is controlled to be larger than the width of the adhesion region times an adhesion thickness, and sufficiently smaller than the width of the adhesion region times the adhesion thickness plus the width of the second adhesive escape groove times the depth of the second adhesive escape groove. Then, the width of the adhesion region will be approximately equal to the adhesion width. Here again, it is desirable that the adhesive does not reach the bottom of the inner circumference of the second adhesive escape groove disposed outside the adhesion region or the outer peripheral wall of the second adhesive escape groove. To meet this requirement, it is desirable that the width of the second adhesive escape groove be larger than half the width of the adhesion region 43 plus tolerance, and that the volume of the adhesive application per unit length be more than the width of the adhesion region times the adhesion thickness and less than [the width of the adhesion region times the adhesion thickness+(half the width of the adhesion region plus tolerance×2×the depth of the second adhesive escape groove)]× 0.5.

In a case of a design with adjacent adhesive escape grooves 44 disposed very closely, favorable structures are shown respectively in FIGS. 8B1 and 8B2 in which an adhesion escape groove is partly joined with an adjacent adhesive escape groove, and in FIGS. 8D1 and 8D2 in which all adhesive escape grooves are joined together. These structures are easier in the cutting process although the strength of the sealing glass substrate 41 is somewhat decreased. In both the structure of FIGS. 8B1 and 8B2 in which an adhesion escape groove is partly joined with an adjacent adhesive escape groove, and the structure of FIGS. 8D1 and 8D2 in which all adhesive escape grooves are joined together, the depth of the adhesive escape groove is preferably in the range as described previously, although it is not limited to that range. The part of the adhesive escape groove that is not joined to the adjacent adhesive escape groove in the structure of FIGS. 8B1 and 8B2 preferably has the same width as previously described. These structures also can be applied to the second adhesive escape groove in the variation of FIGS. 8A1 and 8A2.

When the decrease of strength of the sealing glass substrate 41 raises no problem, a form illustrated in FIGS. 8C1 and 8C2 can be used in which right angle vertexes are provided in the outer peripheral sidewall of an adhesive escape groove. In addition, structures that are combinations of these configurations are within the scope of the invention. In those structures, the width and depth of the adhesive escape groove preferably is within the range described previously. This structure of course can be applied to the first and second adhesive escape grooves in the variation of FIGS. 8A1 and 8A2 as well.

The above description is directed to the manufacture of multiple displays using an organic EL substrate including a corresponding number of organic EL laminate parts. However, the invention of course also includes the case in which a display sheet is cut from an organic EL substrate having a single organic EL laminate. Application of the invention to where the substrate is limited to a single organic EL laminate is also effective to control an adhesion width and to decrease a width of "a picture frame."

Figure 7B:
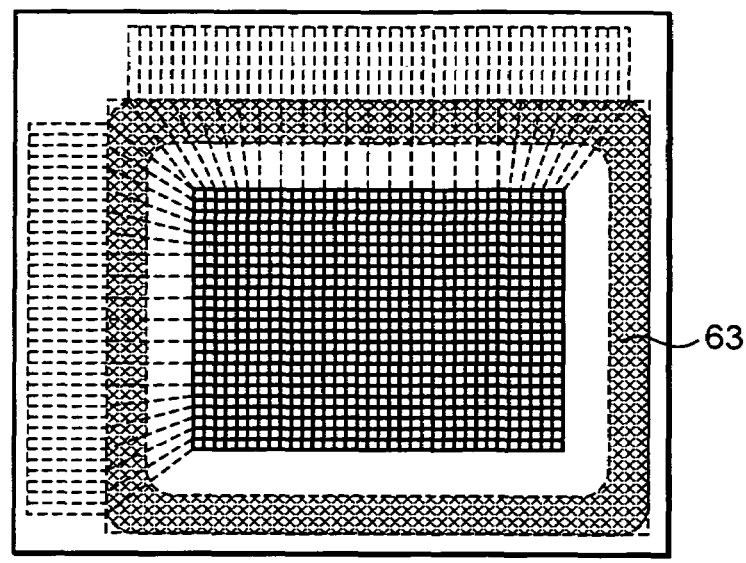
FIGS. 7A, 7B and 7C are respectively a sectional view, a plan view from an organic EL substrate side and a plan view from a sealing substrate side of an organic EL display manufactured by a method of the invention.
Figure 7A:
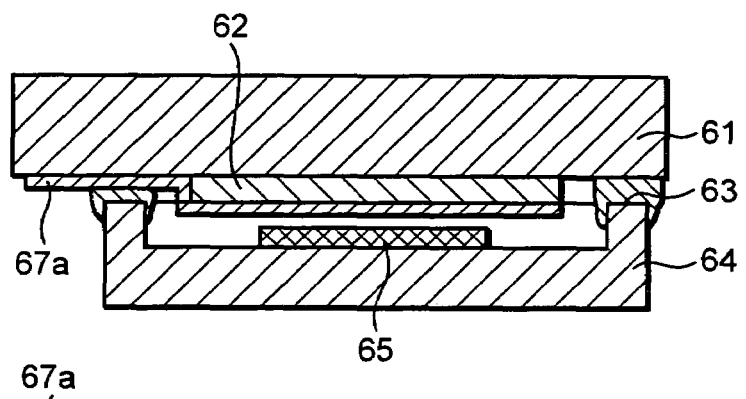
Figure 7C:
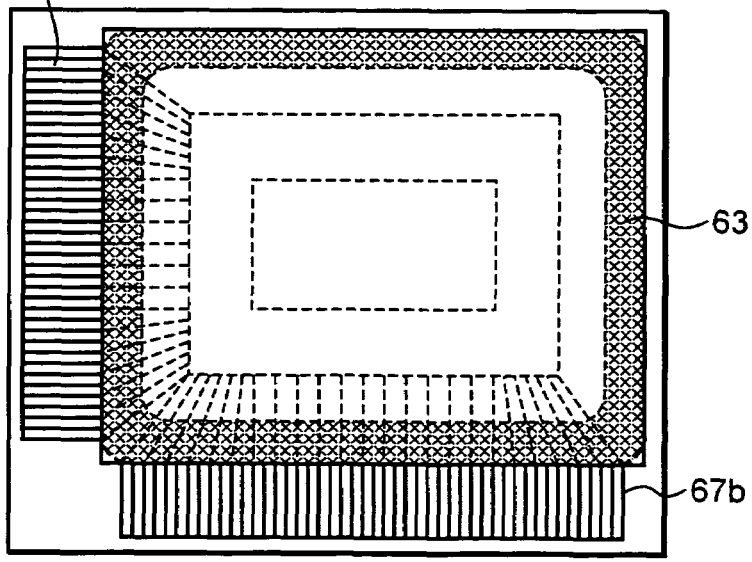
Figure 9A:
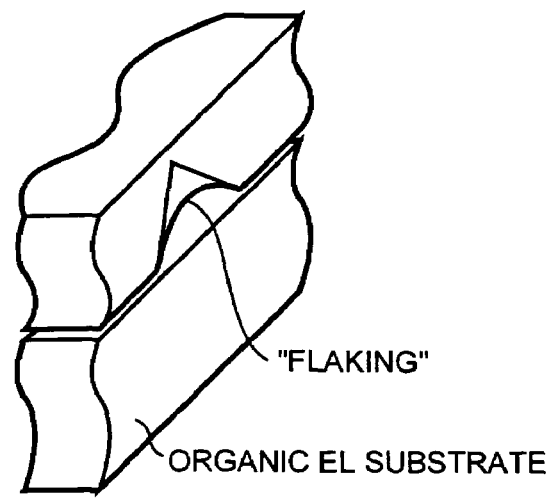
FIGS. 9A-9C illustrate flaking, burrs, and cracking according to the conventional method of manufacturing organic EL displays.
Figure 9B:
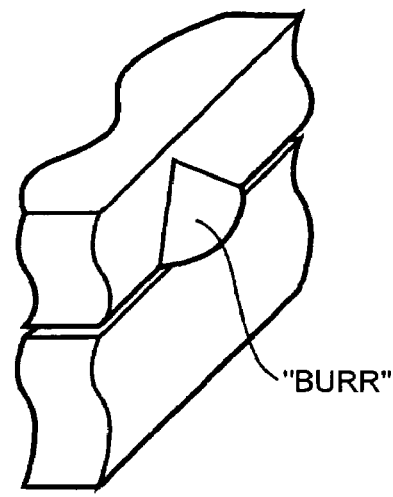
Figure 9C:
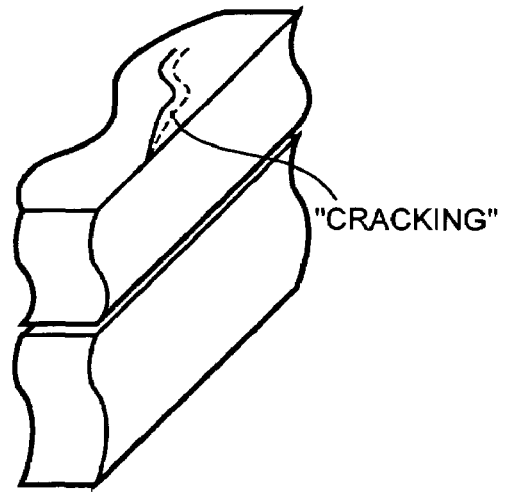

By the laminating and cutting processes described above, an organic EL display shown in FIGS. 7A-7C can be manufactured. As shown in FIG. 7A, on a transparent substrate 61 (a part of the organic EL substrate 53) an organic EL laminate 62 is formed, which includes at least a transparent electrode, an organic EL layer and a reflection electrode, and a lead out terminal 67a electrically connecting to the reflection electrode of the organic EL laminate 62. This structure is sealed by a sealing glass substrate 64 (a part of the sealing glass substrate 41) having a moisture absorber 65 attached to a recess, and by an adhesive 63. FIG. 7B is a plan view of the structure taken from the side of the transparent substrate 61, and FIG. 7C is a plan view of the structure taken from the side of the sealing glass substrate 64. The lead out terminal 67a is electrically connected to the reflection electrode as described above, and the lead out terminal 67b is electrically connected to the transparent electrode.

The transparent electrode can be formed of a transparent conductive oxide such as $SnO_2$, $In_2O_3$, ITO, IZO, or ZnO:Al. The reflection electrode preferably is formed of a high reflectivity metal, amorphous alloy, or micro crystalline alloy. High reflectivity metals include Al, Ag, Mo, W, Ni, and Cr. High reflectivity amorphous alloys include NiP, NiB, CrP, and CrB. High reflectivity micro crystalline alloys include NiAl. For passive matrix driving, the transparent electrode and the reflection electrode are formed of multiple stripe-shaped electrode elements, in which the stripes of the transparent electrode extend in a direction crossing (preferably orthogonally) the direction of the stripes of the reflection electrode. The lead out terminals 67a and 67b can be formed by extending the reflection electrode elements and the transparent electrode elements to the peripheral regions of the substrate, or by depositing high conductivity metal connecting to the reflection electrode elements and the transparent electrode elements.

The organic EL layer has a structure that includes at least an organic light-emitting layer, and as necessary, a hole injection layer, a hole transport layer, an electron transport layer and/or an electron injection layer. These layers can be formed of known materials. To obtain blue to blue-green light emission, the organic light emitting layer contains a material selected from fluorescent whitening agents such as benzothiazole, benzoimidazole, and benzoxazole, metal chelate oxonium compounds, styrylbenzene compounds, and aromatic dimethylidine compounds. Preferred materials for the hole injection layer include phthalocyanine compounds such as copper phthalocyanine and triphenylamine derivatives such as m-MTDATA. Preferred materials for the hole transport layer include biphenyl amine derivatives such as TPD, and α-NPD. The material for the electron transport layer can be selected from oxadiazole derivatives such as PBD, triazole derivatives, and triazine derivatives. The electron injection layer can be formed of an aluminum quinolinol complex, for example. The electron injection layer can also be formed of an alkali metal, an alkaline earth metal, or an alloy containing these metals, or an alkali metal fluoride compound.

The organic EL laminate 62 can further include a color conversion layer and/or a color filter layer as required. The color conversion layer converts the wavelength distribution of the light emitted from the organic EL layer. For example, the blue to blue-green light is converted to the green or red light. The color filter layer selectively transmits the light in a specific wavelength range to improve color purity of the light from the organic EL layer or from the color conversion layer. The color conversion layer and the color filter layer can be formed of commonly used materials. The color conversion layer and the color filter layer are disposed between the transparent electrode and the transparent substrate 61. In the case provided with the both layers, lamination is preferably conducted in the sequence of a transparent substrate 61/a color filter layer/a color conversion layer/a transparent electrode. In the case that a color conversion layer and/or a color filter layer is provided, a passivation layer composed of an inorganic oxide or an inorganic nitride (for example, $SiO_2$, $Si_3N_4$, $SiN_xO_y$, and the like) is preferably further provided between those layers and the transparent electrode.

An organic EL display capable of multicolor display can be formed by providing plural types of color conversion layers and/or color filter layers. An organic EL display capable of full color display can de composed by providing color conversion layers and/or color filter layers for red, green and blue in an appropriate proportion.

EXAMPLES

A sealing glass substrate was manufactured using a non-alkaline glass substrate having a dimension of 230 mm×200 mm and a thickness of 1.1 mm. A resist film was pasted on the glass substrate. By means of sandblasting, nine recesses for accommodating organic EL laminates and adhesive escape grooves each corresponding to each recess were formed. Each recess had a dimension of 56 mm×46 mm and a depth of 0.5 mm. Each adhesive escape groove had a width of 1 mm and a depth of 0.5 mm and was disposed 2 mm outside the recess, that is, an adhesion region 2 mm wide was provided around the recess. The adhesion escape grooves were not connected and were isolated each other.

The thus manufactured sealing glass substrate was cleaned and dried, and then installed in a chamber with both a moisture content and an oxygen content not exceeding 5 ppm. A moisture absorber 0.3 mm thick was attached to the center of each recess of the sealing glass substrate. Ultraviolet light-hardening type epoxy adhesive mixed with 6 μm glass beads was applied on the adhesion region of the sealing glass substrate using a dispenser robot. The volume of applied adhesive was 0.03 mm³ per unit length (1 mm).

The chamber was evacuated to a pressure of −20 kPa (gauge pressure) and the sealing glass substrate having the applied adhesive was combined with an organic EL substrate having nine organic EL laminates, and fabricated using a non-alkaline glass substrate 0.7 mm thick. The two substrates were laminated with a mechanically exerted pressure of 5 kPa. After restoring the atmospheric pressure in the chamber, the epoxy adhesive was cured by irradiation with ultraviolet light having an intensity around 365 nm (100 W/cm²) for 60 seconds and subsequently heating at 80° C. for 1 hour. The adhesive thickness after curing was 6 to 10 μm and the width of runoff adhesive in the adhesive escape groove was 0.2 mm in one side.

The laminated organic EL substrate and sealing glass substrate were cut using a scribe method. The sealing glass substrate was provided nicks along the inner peripheral sidewalls of the adhesive escape grooves. The organic EL substrate was provided with nicks at predetermined positions (0.5 mm outside the lead out terminals at a location corresponding to the lead out terminals, or 0.5 mm outside position the inner peripheral sidewall of the adhesive escape groove at the location without the lead out terminals). An automatic breaking apparatus was used to cut into multiple organic EL displays. No defects such as incomplete cutting or crack were detected.

What is claimed is:

1. A sealing glass substrate for sealing an organic EL substrate having one or more organic EL (electroluminescent) laminates thereon, the sealing glass substrate comprising:
   a glass plate having
   one or more recesses each opposing a respective one of the organic EL laminates,
   one or more adhesion regions each surrounding a respective one of the one or more recesses, and
   one or more cutting line means consisting of one or more adhesive escape grooves each surrounding a respective one of the one or more adhesion regions.

2. The sealing glass substrate according to claim 1, wherein each adhesion region has a width in a range of 1 to 5 mm, and each adhesive escape groove has a depth in a range of to 600 μm.

3. The sealing glass substrate according to claim 1, wherein each adhesive escape groove has a width in a range of 0.5 to 2 mm.

4. A method of manufacturing organic EL displays with a sealing glass substrate as defined in claim 1, comprising the steps of:
   preparing an organic EL substrate that includes one or more organic EL laminates;
   applying adhesive to the one or more adhesion regions;
   adhering the organic EL substrate and the sealing glass substrate with the applied adhesive;

cutting the sealing glass substrate along inner peripheral sidewalls of the adhesive escape grooves; and cutting the organic EL substrate along positions outside the inner peripheral sidewalls of the adhesive escape grooves.

5. The method according to claim 4, wherein the applied adhesive has thickness in a range of 1 to 30 µm following said step of adhering.

6. The method according to claim 4, wherein said step of applying adhesive includes applying a volume of the adhesive per unit length of at least [a width of the adhesion region X a thickness of adhesive to be obtained after said step of adhering], and at most [(the width of the adhesion region X the thickness of adhesive to be obtained after said step of adhering)+(a width of the adhesive escape groove X a depth of the adhesive escape groove)].

7. The method according to claim 6, wherein the applied adhesive has thickness in a range of 1 to 30 µm following said step of adhering.

8. An organic EL display structure with a sealing glass substrate according to claim 1, comprising:

an organic EL substrate;

a plurality of organic EL laminates on the organic EL substrate, wherein said one or more recesses comprises a plurality of recesses, each opposing a respective one of the organic EL laminates and said one or more adhesion regions comprises a plurality of adhesion regions, each surrounding a respective one of the recesses; and adhesive on the adhesion regions, adhering the sealing glass substrate to the organic EL substrate.

9. The organic EL display structure according to claim 8, wherein vertexes of an inner peripheral surface of each adhesive escape groove are right angle vertexes, vertexes of an outer peripheral surface of each adhesive escape groove are rounded, each adhesion region has a width in a range of 1 to 5 mm, each adhesive escape groove has a depth in a range of 100 to 600 µmm, and each adhesive escape groove has a width in a range of 0.5 to 2 mm.

10. The sealing glass substrate as claimed in claim 1, wherein the one or more recesses and the one or more adhesive escape grooves have substantially the same depth.

11. The sealing glass substrate according to claim 10, wherein vertexes of an inner peripheral surface of each adhesive escape groove are right angle vertexes, and vertexes of an outer peripheral surface of each adhesive escape groove are rounded.

12. The sealing glass substrate according to claim 10, wherein each adhesion region has a width in a range of 1 to 5 mm, and each adhesive escape groove has a depth in a range of 100 to 600 µm.

13. The sealing glass substrate according to claim 10, wherein each adhesive escape groove has a width in a range of 0.5 to 2 mm.

14. A method of manufacturing organic EL displays with a sealing glass substrate as defined in claim 10, comprising the steps of:

preparing an organic EL substrate that includes one or more organic EL laminates;

applying adhesive to the one or more adhesion regions;

adhering the organic EL substrate and the sealing glass substrate with the applied adhesive;

cutting the sealing glass substrate along inner peripheral sidewalls of the adhesive escape grooves; and cutting the organic EL substrate along positions outside the inner peripheral sidewalls of the adhesive escape grooves.

15. An organic EL display structure with a sealing glass substrate according to claim 10, comprising:

an organic EL substrate;

a plurality of organic EL laminates on the organic EL substrate, wherein said one or more recesses comprises a plurality of recesses, each opposing a respective one of the organic EL laminates and said one or more adhesion regions comprises a plurality of adhesion regions, each surrounding a respective one of the recesses; and adhesive on the adhesion regions, adhering the sealing glass substrate to the organic EL substrate.

16. A sealing glass substrate for sealing an organic EL substrate having one or more organic EL (electroluminescent) laminates thereon, the sealing glass substrate comprising:

a glass plate having one or more recesses each opposing a respective one of the organic EL laminates, one or more adhesion regions each surrounding a respective one of the one or more recesses, and one or more adhesive escape grooves each surrounding a respective one of the one or more adhesion regions, wherein each adhesive escape groove has an inner peripheral surface and an outer peripheral surface with respective vertexes, wherein the vertex of each inner peripheral surface is a right angle vertex, and wherein the vertex of each outer peripheral surface is rounded.

17. A sealing glass substrate for sealing an organic EL substrate having one or more organic EL laminates thereon, the sealing glass substrate comprising:

a glass plate having one or more adhesion regions each opposing an outer periphery of a respective one of the one or more organic EL laminates, one or more first adhesive escape grooves each surrounded by a respective one of the one or more adhesion regions, and one or more cutting line means consisting of one or more second adhesive escape grooves each surrounding a respective one of the one or more adhesion regions.

18. The sealing glass substrate for organic EL according to claim 17, wherein each adhesion region has a width in a range of 1 to 5 mm, and a depth of each first adhesive escape groove and second adhesive escape groove is in a range of 100 to 600 µm.

19. The sealing glass substrate according to claim 17, wherein each first adhesive escape groove and each second adhesive escape groove has a width in a range of 0.5 to 2 mm.

20. The sealing glass substrate according to claim 17, further comprising one or more recesses each opposing a respective one of the one or more organic EL laminates and being distinct from the one or more first adhesive escape grooves.

21. A method of manufacturing organic EL displays with a sealing glass substrate as defined in claim 17, comprising the steps of:

preparing an organic EL substrate that includes one or more organic EL laminates;

applying adhesive to the one or more adhesion regions of the sealing glass substrate;

adhering the organic EL substrate and the sealing glass substrate with the applied adhesive;

for each adhesion region, cutting the sealing glass substrate along inner peripheral sidewall of the second adhesive escape groove surrounding the adhesion region; and for each adhesion region, cutting the organic EL substrate along positions outside inner peripheral sidewall of the second adhesive escape groove surrounding the adhesion region.

22. The method according to claim 21, wherein the applied adhesive has a thickness in a range of 1 to 30 μm following said step of adhering.

23. The method according to claim 21, wherein said step of applying adhesive includes applying to each adhesion region an amount of the adhesive per unit length of
- at least a width of the adhesion region X a thickness of the adhesive to be obtained following said step of adhering, and
- at most (the width of the adhesion region X the thickness of the adhesive to be obtained following said step of adhering)+(a width of the second adhesive escape groove X a depth of the second adhesive escape groove).

24. The method according to claim 23, wherein the applied adhesive has thickness in a range of 1 to 30 μm following said step of adhering.

25. An organic EL display structure with a sealing glass substrate according to claim 17, comprising:
- an organic EL substrate;
- a plurality of organic EL laminates on the organic EL substrate, wherein said one or more recesses comprises a plurality of recesses, each opposing a respective one of the organic EL laminates; and
- adhesive on each adhesion region of the sealing glass substrate, adhering the sealing glass substrate to the organic EL substrate.

26. The organic EL display structure according to claim 25, wherein
- vertexes of an inner peripheral surface of the adhesive escape groove are right angle vertexes,
- vertexes of an outer peripheral surface of each adhesive escape groove are rounded,
- each adhesion region has a width in a range of 1 to 5 mm,
- each adhesive escape groove has a depth in a range of 100 to 600 μm, and
- each adhesive escape groove has a width in a range of 0.5 to 2 mm.

27. A sealing glass substrate for sealing an organic EL substrate having one or more organic EL laminates thereon, the sealing glass substrate comprising:
- a glass plate having
- one or more adhesion regions each opposing an outer periphery of a respective one of the one or more organic EL laminates,
- one or more first adhesive escape grooves each surrounded by a respective one of the one or more adhesion regions, and
- one or more second adhesive escape grooves each surrounding a respective one of the one or more adhesion regions,
- wherein each first adhesive escape groove and each second adhesive escape groove has an inner circumference and an outer circumference with respective vertexes, wherein the vertex of each inner circumference is a right angle vertex, and wherein the vertex of each outer circumference is rounded.

* * * * *